(12) United States Patent
Galloway et al.

(10) Patent No.: US 7,315,217 B2
(45) Date of Patent: Jan. 1, 2008

(54) LINEAR PHASE-LOCKED LOOP WITH DUAL TUNING ELEMENTS

(75) Inventors: Brian Jeffrey Galloway, Campbell, CA (US); Gunter Willy Steinbach, Palo Alto, CA (US); Charles Moore, Loveland, CA (US)

(73) Assignee: Avago Technologies General IP (Singapore) Pte Ltd., Singapore (SG)

( * ) Notice: Subject to any disclaimer, the term of this patent is extended or adjusted under 35 U.S.C. 154(b) by 182 days.

(21) Appl. No.: 11/084,376

(22) Filed: Mar. 18, 2005

(65) Prior Publication Data

US 2006/0208805 A1    Sep. 21, 2006

(51) Int. Cl.
*H03L 7/00*    (2006.01)
(52) U.S. Cl. .......................... 331/34; 331/16
(58) Field of Classification Search ........... 331/34, 331/16
See application file for complete search history.

(56) References Cited

U.S. PATENT DOCUMENTS

| | | | | |
|---|---|---|---|---|
| 3,805,183 | A * | 4/1974 | Lance | 331/18 |
| 4,942,370 | A | 7/1990 | Shigemori | |
| 5,600,272 | A | 2/1997 | Rogers | |
| 5,740,213 | A * | 4/1998 | Dreyer | 375/374 |
| 5,821,789 | A | 10/1998 | Lee | |
| 5,870,003 | A * | 2/1999 | Boerstler | 331/17 |
| 6,320,435 | B1 * | 11/2001 | Tanimoto | 327/156 |
| 6,614,316 | B2 * | 9/2003 | Masenas et al. | 331/17 |
| 6,693,496 | B1 * | 2/2004 | Lebouleux | 331/185 |
| 7,009,456 | B2 * | 3/2006 | Jasa et al. | 331/16 |
| 7,019,571 | B2 * | 3/2006 | Lim | 327/157 |
| 2005/0218998 | A1 * | 10/2005 | Lim | 331/16 |

FOREIGN PATENT DOCUMENTS

DE    38 06 461    3/1988
JP    01218214 A    8/1989

OTHER PUBLICATIONS

Search Report for counterpart UK patent application No. GB0605480.3 from UK Patent Office, issued 30 May 2006, 3 pages.
Novof, Ilya, "Fully Integrated CMOS Phase-Locked Loop with 15 to 240 MHz Locking Range and +- 50 ps Jitter," IEEE Journal of Solid-State Circuits, vol. 30, No. 11, Nov. 1995.

(Continued)

*Primary Examiner*—Joseph Chang (57) ABSTRACT

A linear PLL includes a VCO with first and second tuning elements. The first tuning element is adjusted in proportion to the phase error between an input signal and a VCO signal and the second tuning element is adjusted by an integral function of the phase error. By configuring the VCO with separate tuning elements that are separately adjusted in proportion to the phase error and by an integral function of the phase error, the 3dB bandwidth frequency of the linear PLL depends primarily on the phase detector gain and the VCO gain that is contributed from the proportional adjustment. A linear PLL with separate proportional and integral tuning elements can be designed to exhibit a relatively constant gain over a relatively large frequency range.

17 Claims, 6 Drawing Sheets

OTHER PUBLICATIONS

Greshishchev, Yuriy, "SiGe Clock and Data Recovery IC with Linear-Type PLL for 10-Gb/s SONET Application," IEEE Journal of Solid-State Circuits, vol. 35, No. 9, Sep. 2000.

Hogge, Charles, R., "A Self Correcting Clock Recovery Circuit," Journal of Lightwave Technology, vol. LT-3, No. 6, Dec. 1985.

Office Action dated Mar. 20, 2007, from corresponding application number DE 10 2006 012 428.6-35 and English Translation.

Underhill, M.J. and Jordan, P.A. "Split-Loop Method for Wide-Range Frequency Synthesizer with Good Dynamic Performance", IN: Electronics Letters, vol. 15, Jun. 1979 No. 13, pp. 391-393.

* cited by examiner

LINEAR PHASE-LOCKED LOOP WITH DUAL TUNING ELEMENTS

BACKGROUND OF THE INVENTION

Phase-locked loops (PLLs) are used in data communications and telecommunications applications to lock onto the frequency and phase of a signal. In particular, monolithic PLLs are often used in clock and data recovery (CDR) applications. A typical monolithic PLL includes a phase detector, a charge pump, a loop filter, and a voltage controlled oscillator (VCO) that produces a VCO signal. Monolithic PLLs used for CDR are typically divided into two categories; either a linear PLL, which uses a Hogge-type linear phase detector or a binary or "bang-bang" PLL, which uses an Alexander-type binary phase detector.

One performance characteristic of a PLL is the 3 decibel (dB) bandwidth frequency. The 3 dB bandwidth frequency is a measure of the frequency range within which the PLL is able to track frequency changes of the input signal. With typical linear PLLs, the 3 dB bandwidth frequency is a function of the phase detector gain, the charge pump gain, the VCO gain, and the loop zero resistance. The phase detector gain, the charge pump gain, and the loop zero resistance can each vary by ±20%, while the VCO gain often varies by 5-to-1 or more. When using a resonant inductance capacitance (LC)-type VCO, the wide variation in the VCO gain is due to the non-linear capacitance vs. voltage characteristic of monolithic variable capacitors (i.e., varactors) and the inverse square root dependence of the VCO frequency on the LC tank capacitance of the VCO.

The variation of the VCO gain in a linear PLL with an LC-type VCO can be reduced by limiting the voltage range that is used to tune the VCO. While limiting the voltage tuning range reduces the variation in VCO gain, it also limits the frequency range over which the VCO can be tuned and therefore, there is a tradeoff between the magnitude of variation in the VCO gain and the frequency range of a VCO.

In view of this, what is needed is a linear PLL that exhibits relatively constant gain and a wide frequency tuning range.

SUMMARY OF THE INVENTION

A linear PLL includes a VCO with first and second tuning elements. The first tuning element is adjusted in proportion to the phase error between an input signal and a VCO signal and the second tuning element is adjusted by an integral function of the phase error. By configuring the VCO with separate tuning elements that are separately adjusted in proportion to the phase error and by an integral function of the phase error, the 3 dB bandwidth frequency of the linear PLL depends primarily on the phase detector gain and the VCO gain contributed from the proportional adjustment. A linear PLL with separate proportional and integral tuning elements exhibits a relatively constant gain over a relatively large frequency range.

Other aspects and advantages of the present invention will become apparent from the following detailed description, taken in conjunction with the accompanying drawings, illustrating by way of example the principles of the invention.

BRIEF DESCRIPTION OF THE DRAWINGS

Throughout the description similar reference numbers are used to identify similar elements.

DETAILED DESCRIPTION

The task of a phase-locked loop (PLL) is to lock the phase and frequency of a voltage controlled oscillator (VCO) signal to a signal, referred to herein as an input signal. In accordance with the invention, a linear PLL includes a VCO with first and second tuning elements. The first tuning element is adjusted in proportion to the phase error between an input signal and a VCO signal and the second tuning element is adjusted by an integral function of the phase error.

Figure 1:
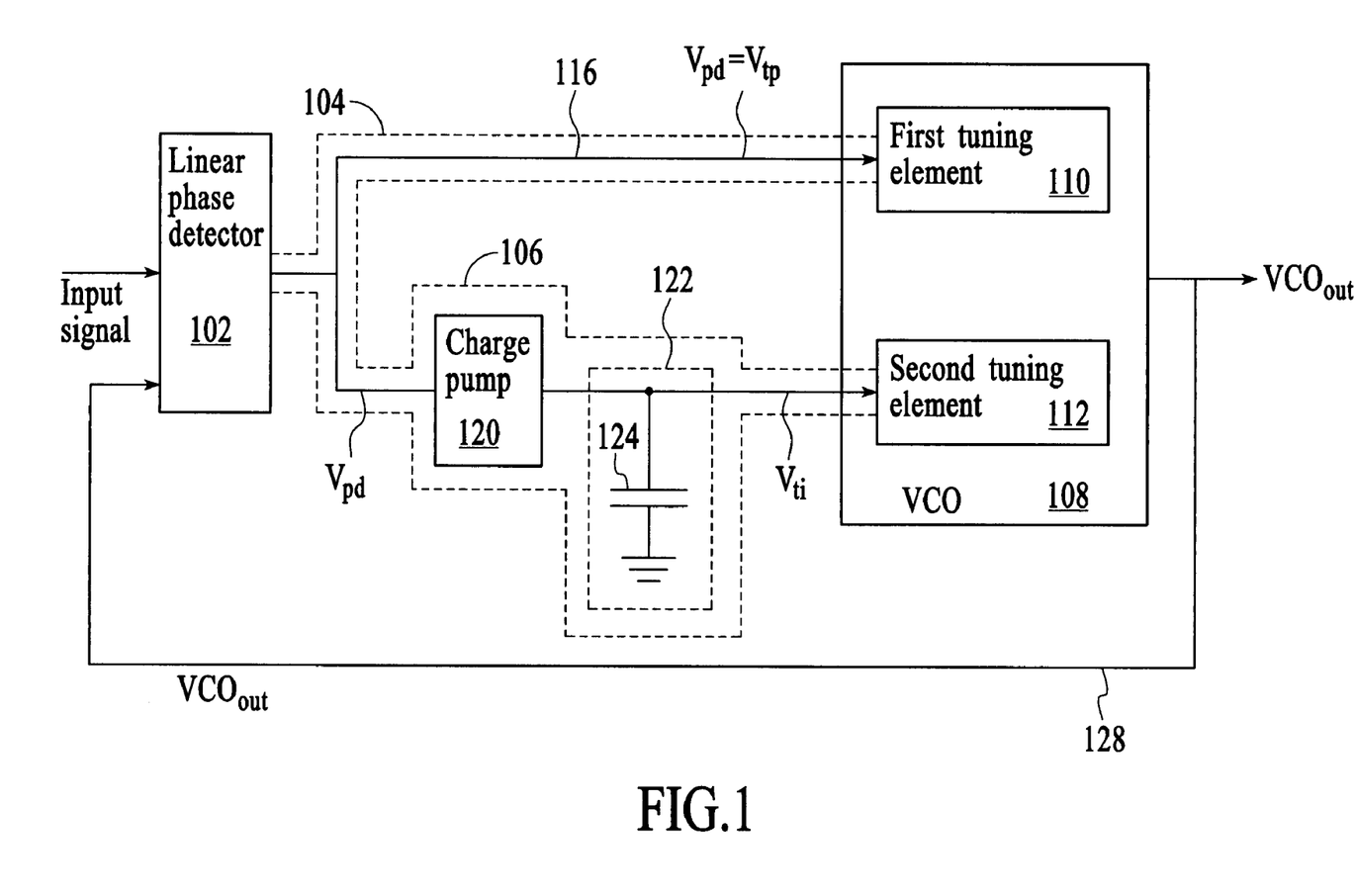
FIG. 1 depicts an embodiment of a linear PLL that includes a linear phase detector, a proportional signal path, an integrating signal path, and a VCO in accordance with an embodiment of the invention.

FIG. 1 depicts an embodiment of a linear PLL 100 that includes a linear phase detector 102, a first signal path 104 (referred to herein as the "proportional" signal path), a second signal path 106 (referred to herein as the "integrating" signal path), and a VCO 108. In the embodiment of FIG. 1, the VCO is an inductance capacitance (LC)-type VCO, which includes first and second tuning elements 110 and 112 that are adjusted as described below to lock the phase and frequency of the VCO signal to the input signal.

With reference to FIG. 1, the linear phase detector 102 is connected to receive an input signal from a signal source (not shown) and a portion of the VCO signal ($VCO_{out}$) from the VCO 108. The input signal carries clock information and data that is to be recovered. As part of the linear PLL operation, the linear phase detector compares transitions of the input signal with transitions of the VCO signal and generates an output signal that is representative of the sign and magnitude of the phase error between the input signal and the VCO signal, with the sign indicating whether the phase of the input signal is leading or lagging the phase of the VCO signal. In the embodiment of FIG. 1, the linear phase detector is a Hogge-type phase detector that produces an output voltage ($V_{pd}$) proportional to the phase error between the input signal and the VCO signal. The output from the linear phase detector is provided to the proportional signal path 104 and to the integrating signal path 106 of the linear PLL 100.

The proportional signal path 104 of the linear PLL 100 includes a signal connection 116 between the linear phase detector 102 and the VCO 108. In the embodiment of FIG. 1, the proportional signal path provides a direct signal connection between the linear phase detector and the first tuning element 110 of the VCO. The proportional signal path enables a first VCO tuning signal (referred to as the proportional VCO tuning signal) to be provided to the first tuning element directly from the linear phase detector. The proportional VCO tuning signal (identified in FIG. 1 as $V_{tp}$) is proportional to the instantaneous phase error between the input signal and the VCO signal (in the example of FIG. 1, $V_{pd}=V_{tp}$). That is, the proportional VCO tuning signal is indicative of the instantaneous phase error as measured by the linear phase detector. The proportional VCO tuning signal is used to adjust the first tuning element of the VCO in proportion to the instantaneous phase error between the input signal and the VCO signal. The proportional signal path may also include a pole or low-pass filter. The pole or low-pass filter has a high enough frequency, as compared to the loop bandwidth, that the pole or low-pass filter does not significantly impact the PLL dynamics. Therefore, even if the proportional signal path includes a pole or low-pass filter, the proportional signal path will still provide a VCO tuning signal that is considered proportional to the phase error when compared to the VCO tuning signal that comes from the integrating signal path 106.

The integrating signal path 106 of the linear PLL includes a charge pump 120 and a loop filter 122. The integrating signal path connects the linear phase detector 102 to the second tuning element 112 of the VCO 108 via the charge pump and the loop filter. Referring to the integrating signal path, the output signal (e.g., $V_{pd}$) from the linear phase detector is provided to the charge pump. The charge pump provides a charging current to the loop filter in response to the output signal from the linear phase detector. The charging current generated by the charge pump is proportional to the output signal from the linear phase detector. The charging current is applied to the loop filter, which includes a capacitance ($C_0$) that is represented by a capacitor 124. A second VCO tuning signal (referred to as the integrated VCO tuning signal) is generated in response to the charging current from the charge pump and the loop filter capacitance. Because of the loop filter, the integrated VCO tuning signal (identified in FIG. 1 as $V_{ti}$) is an integral function of the phase error between the input signal and the VCO signal. That is, the integrated VCO tuning signal is indicative of the integral of the phase error over an integration time. The integrated VCO tuning signal is used to adjust the second tuning element of the VCO. The integrating signal path, the integrated VCO tuning signal, and the second tuning element allow the VCO to be tuned as an integral function of the phase error.

Operation of the linear PLL 100 depicted in FIG. 1 involves tuning the VCO 108 in response to feedback from the proportional and integrating signal paths 104 and 106. Starting at the VCO for description purposes, the VCO receives the proportional and integrated VCO tuning signals ($V_{tp}$ and $V_{ti}$, respectively) from the proportional and integrating signal paths and produces a VCO signal ($VCO_{out}$) as an output. A portion of the VCO signal ($VCO_{out}$) is fed back into the linear phase detector 102 as indicated by feedback connection 128. The linear phase detector compares the phase of the input signal to the phase of the VCO signal and generates an output signal (e.g., $V_{pd}$) that is proportional to the phase error between the input signal and the VCO signal. The output signal from the linear phase detector is provided to the proportional and integrating signal paths and the corresponding proportional and integrated VCO tuning signals are used to adjust the first and second tuning elements 110 and 112 of the VCO. As described above, the first tuning element 110 of the VCO 108 allows the VCO to be tuned in proportion to the phase error and the second tuning element 112 of the VCO allows the VCO to be tuned as an integral function of the phase error.

Figure 2:
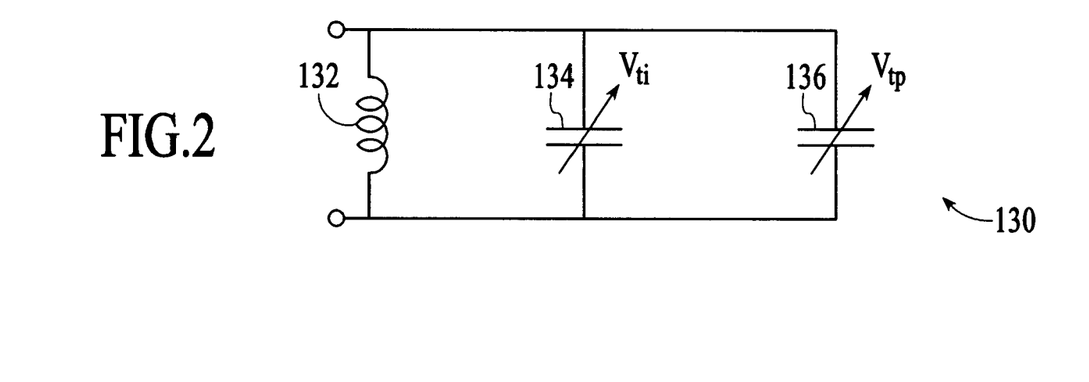
FIG. 2 depicts a tank circuit of an LC-type VCO, which can be incorporated into the linear PLL of FIG. 1.

FIG. 2 depicts an embodiment of the tank circuit 130 of the LC-type VCO 108 from FIG. 1. The tank circuit includes an inductance (L) represented by an inductor 132 and first and second tuning elements 134 and 136. In the embodiment of FIG. 2, the first and second tuning elements are voltage-variable capacitors (also known as varactors). The first tuning element 134 is a varactor that is tuned in response to the proportional VCO tuning signal ($V_{tp}$) and the second tuning element 136 is a varactor that is tuned in response to the integrated VCO tuning signal ($V_{ti}$). Although FIG. 2 depicts one example of a VCO with the first and second tuning elements, the first and second tuning elements can be any component or circuit that can change the frequency of the VCO in response to a tuning signal.

Figure 3:
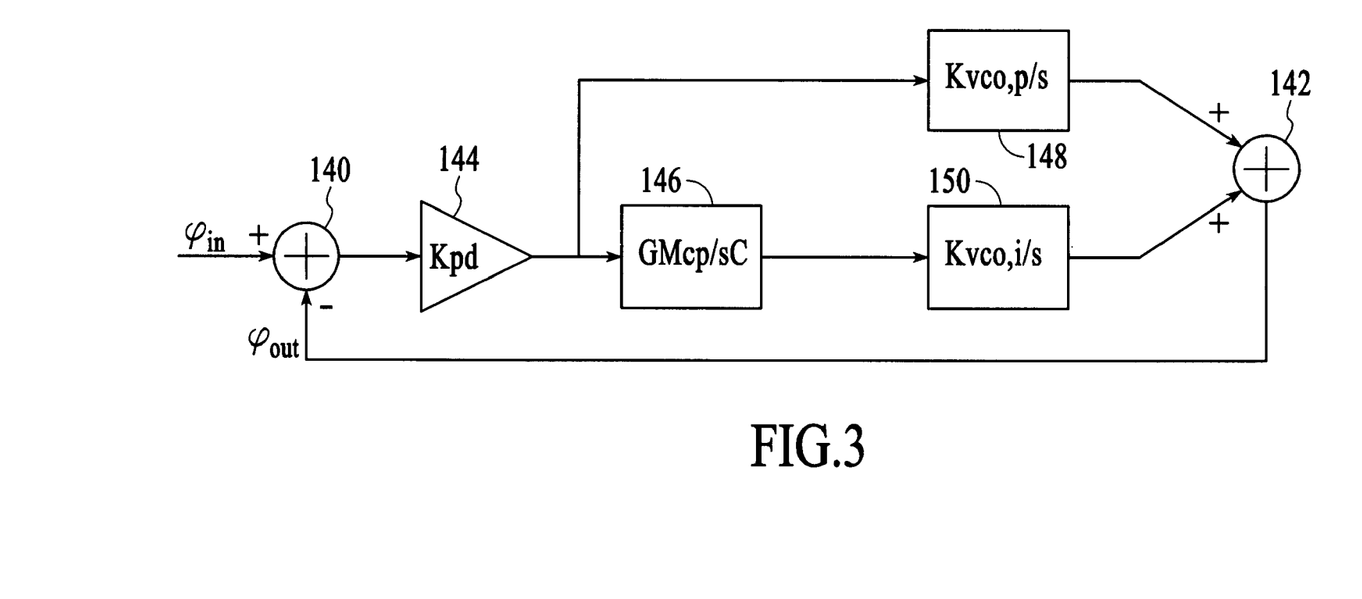
FIG. 3 is a functional representation of the linear PLL from FIGS. 1 and 2 in the frequency domain.

Calculation of the 3 dB bandwidth frequency of the linear PLL 100 from FIGS. 1 and 2 is now described with reference to FIG. 3. FIG. 3 is a functional representation of the linear PLL from FIGS. 1 and 2 in the frequency domain. This representation includes logical summers 140 and 142 and is convenient for use in describing the 3 dB bandwidth frequency calculation. Although higher order poles may be present, they are not significant to the 3 dB bandwidth frequency calculation. The terms depicted in FIG. 3 are defined as follows:

$\phi_{in}$=input phase $\phi_{out}$=output phase $K_{pd}$=phase detector gain 144 [Volts/2π radians of error]

$GM_{cp}$=charge pump mutual conductance 146 [Amps/Volt]

1/sC=transfer function of the loop filter $GM_{cp}$/sC=transfer function from input of charge pump to input of VCO, includes the charge pump and integrating capacitor, C $K_{vco,p}$=VCO gain 148 contributed from the proportional signal path [Hz/Volt]

$K_{vco,i}$=VCO gain 150 contributed from the integrating signal path [Hz/Volt]

$K_{vco}$/s=transfer function of a VCO, integration of frequency to get phase

Solving the loop equations from the functional representation of FIG. 3 yields the following transfer function for $\phi_{out}/\phi_{in}$:

$$\frac{\varphi_{out}}{\varphi_{in}} = \frac{s \cdot K_{pd} K_{vco,p} + (K_{pd} \cdot GM_{cp} \cdot K_{vco,i})/C}{s^2 + s \cdot K_{pd} \cdot K_{vco,p} + (K_{pd} \cdot GM_{cp} \cdot K_{vco,i})/C} \quad (1)$$

The loop equation (1) is that of a second order loop.

In some applications (e.g., to meet SONET jitter peaking specifications), it is necessary for the linear PLL to be highly stable. Essentially, the linear PLL should look first order for close to two decades of frequency below the 3 dB bandwidth frequency. For the linear PLL to look first order, the gain contributed from the integrating signal path (as defined by ($K_{pd} \cdot GM_{cp} \cdot K_{vco,i}$)/(s·C)) must be small compared to the gain contributed from the proportional signal path (as defined by $K_{pd} \cdot K_{vco,p}$) near the 3 dB bandwidth frequency. At frequencies where the gain contributed from the integrating signal path is small compared to the gain contributed from the proportional signal path, the loop equation reduces to:

$$\frac{\varphi_{out}}{\varphi_{in}} = \frac{K_{pd} \cdot K_{vco,p}}{s + K_{pd} \cdot K_{vco,p}} \quad (2)$$

Equation (2) is the form of a simple low pass filter. Solving for the 3 dB bandwidth frequency using equation (2) yields:

$$f_{3dB} = \frac{K_{pd} \cdot K_{vco,p}}{2\pi} \quad (3)$$

From equation (3), it can be seen that the 3 dB bandwidth frequency ($f_{3dB}$) of the linear PLL from FIGS. 1 and 2 depends only on the phase detector gain ($K_{pd}$) and the VCO gain contributed from the proportional signal path ($K_{vco,p}$). In a traditional clock and data recovery (CDR) linear PLL architecture, the VCO has a single input from an integrating signal path and a single tuning element that is adjusted in response to an integral function of the phase error. Because the loop filter contains an integration and a zero, the 3 dB bandwidth frequency of the traditional CDR linear PLL depends on the phase detector gain ($K_{pd}$), the charge pump mutual conductance ($GM_{cp}$), the VCO gain ($K_{vco,i}$) and the loop zero resistance, all of which lead to inconsistencies in the gain response of the PLL. The PLL as described above with reference to FIGS. 1 and 2 is easier to design for a relatively constant gain, at least with respect to $K_{vco,p}$, which sets the 3 dB bandwidth frequency.

The linear PLL described with reference to FIGS. 1 and 2 has a zero at the frequency where the gain contributed from the proportional signal path ($K_{pd} \cdot K_{vco,p}$) is equal to the gain contributed from the integrating signal path ($K_{pd} \cdot GM_{cp} \cdot KV_{cov,i}$)/(s·C). This occurs at:

$$f_{zero} = \frac{(K_{pd} \cdot GM_{cp} \cdot K_{vco,i})/C}{2\pi \cdot K_{pd} \cdot K_{vco,p}} \quad (4)$$

The frequency of the zero is important for controlling jitter peaking. The frequency of the zero should be approximately two decades or more below the 3 dB bandwidth frequency, or excess peaking will occur.

As shown by equation (3), the 3 dB bandwidth frequency for the linear PLL of FIGS. 1 and 2 depends only on the phase detector gain ($K_{pd}$) and the VCO gain from the proportional signal path 104 ($K_{vco,p}$), so the first tuning element 110 should be operated in a region of relatively constant gain. Since the linear phase detector 102 causes no adjustment of the VCO frequency when the loop is locked (because the output of the phase detector is proportional to the phase error and there is no phase error when the loop is locked), the first tuning element should have a constant bias point in lock conditions. In a traditional CDR linear PLL with a VCO that has a single tuning element, the single tuning element has a bias point that is adjusted to achieve the correct frequency. With the linear PLL described above with reference to FIGS. 1 and 2, the frequency adjustment (via the integrating signal path) is separated from the proportional signal path.

Since the gain contributed from the proportional signal path 104 depends on the total capacitance in the LC-type VCO, the gain does change with frequency. This is because the frequency is adjusted by the integrated VCO tuning signal ($V_{tune,i}$) from the integrating signal path, which adjusts the total capacitance in the LC-type VCO. The ratio of the first tuning element capacitance to the second tuning element capacitance can be adjusted to trade off between the variation in gain and the range of frequency coverage. If the first tuning element makes up a large fraction of the total capacitance, then the gain is relatively flat but the tuning range is relatively small. Conversely, if the first tuning element is a small fraction of the total capacitance, then the gain varies more but the frequency tuning range is relatively large.

Figure 4A:
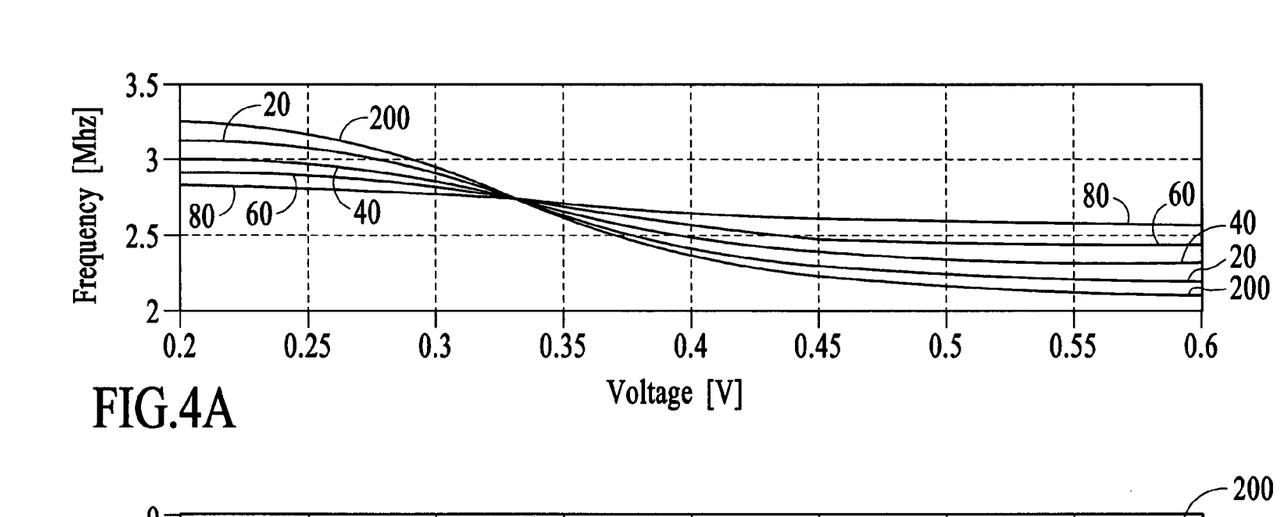
FIG. 4A is a graph of frequency vs. the integrated VCO tuning signal voltage for a linear PLL with a single tuning element and for a linear PLL with first and second tuning elements as described above with reference to FIGS. 1 and 2.
Figure 4B:
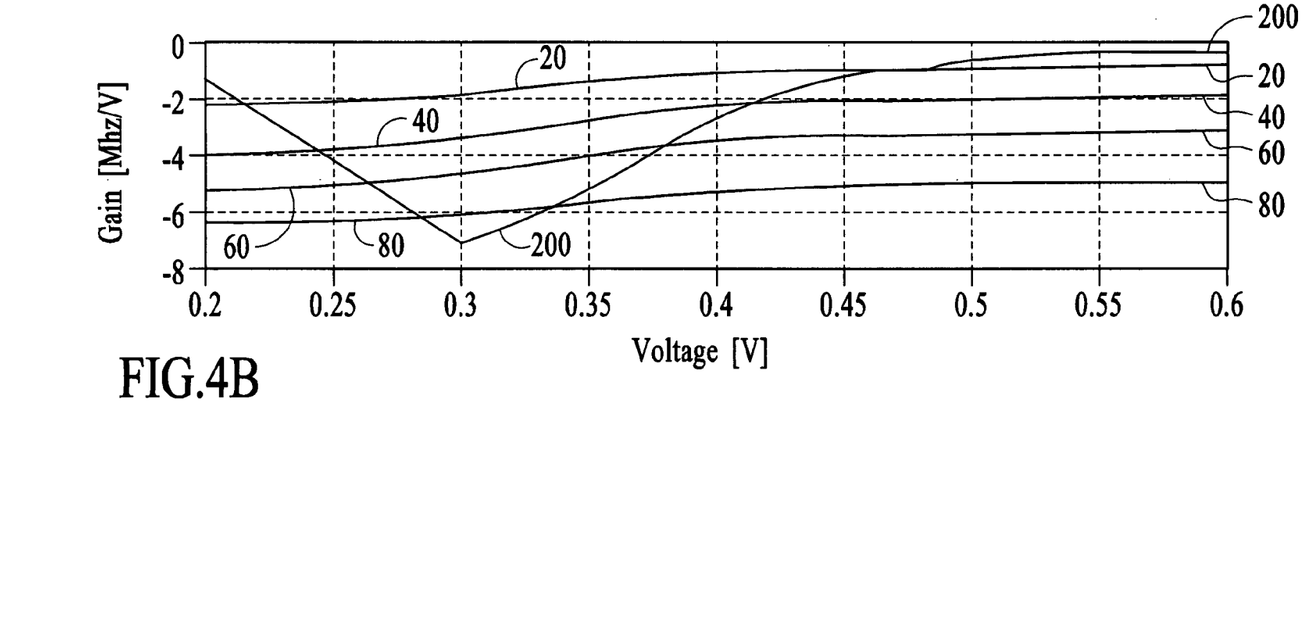
FIG. 4B is a graph of gain vs. the integrated VCO tuning signal voltage for a linear PLL with a single tuning element and for a linear PLL with first and second tuning elements as described above with reference to FIGS. 1 and 2.
Figure 4C:
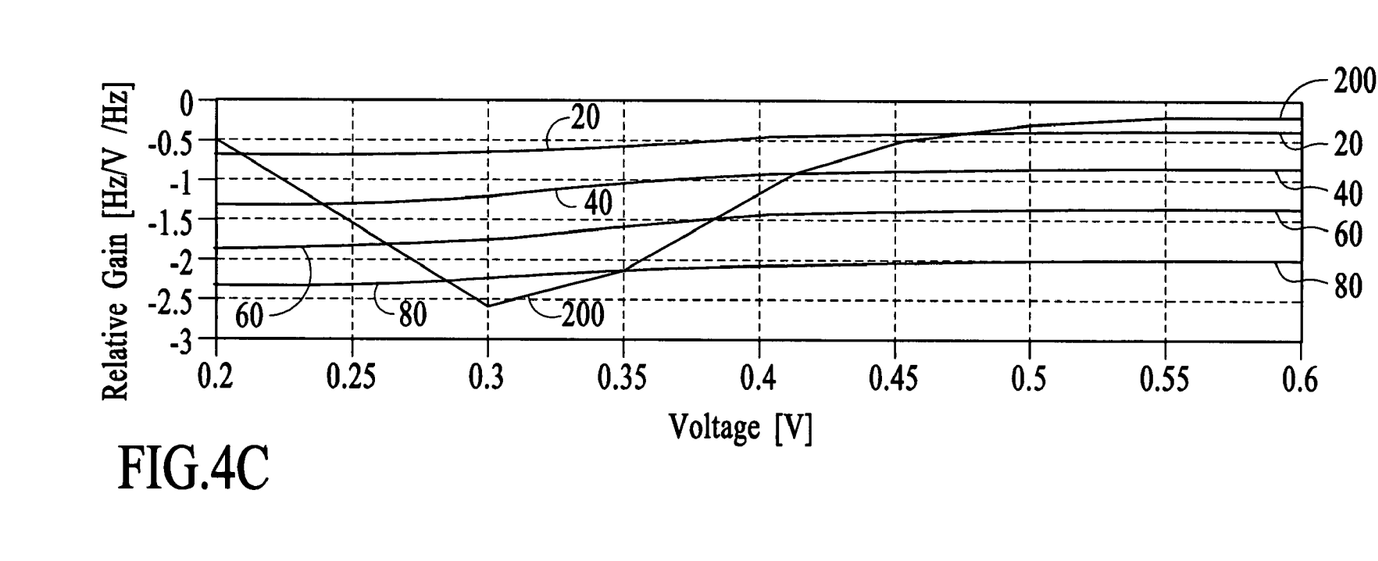
FIG. 4C is a graph of relative gain vs. the integrated VCO tuning signal voltage for a linear PLL with a single tuning element and for a linear PLL with first and second tuning elements as described above with reference to FIGS. 1 and 2.

FIGS. 4A-4C are graphs of frequency, gain, and relative gain vs. the integrated VCO tuning signal voltage for a linear PLL with a single tuning element and for a linear PLL with first and second tuning elements as described above with reference to FIGS. 1 and 2. The graphs of the conventional single tuning element PLL are identified by reference number 200. For the linear PLL with first and second tuning elements, there are four separate graphs for the cases where the ratio of the capacitance between the first tuning element and the second tuning element is 80:20, 60:40, 40:60, and 20:80 (these graphs are identified by reference numbers 80, 60, 40, and 20, respectively). As shown in the graphs, the more capacitance that is dedicated to the first tuning element (the proportional signal path), the smaller the variation in relative gain, but also the smaller the frequency tuning range.

Figure 5:
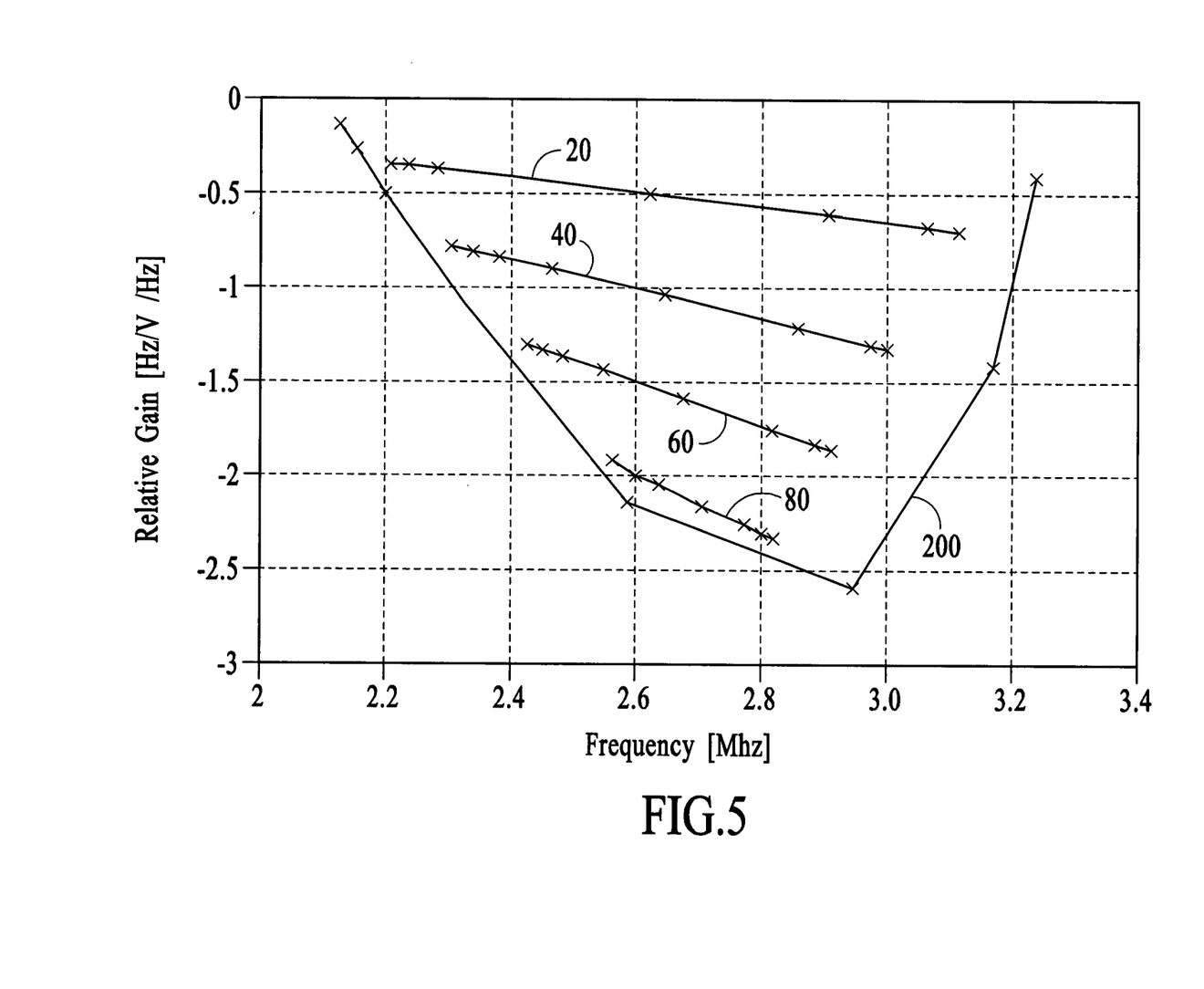
FIG. 5 is a graph of relative gain vs. frequency for a linear PLL with a single tuning element and for a linear PLL with first and second tuning elements as described above with reference to FIGS. 1 and 2.

FIG. 5 is a graph of relative gain vs. frequency for a linear PLL with a conventional single tuning element (identified by reference number 200) and for a linear PLL with first and second tuning elements as described above with reference to FIGS. 1 and 2. As with FIGS. 4A-4C, for the PLL with first and second tuning elements, there are four separate graphs for the cases where the ratio of the capacitance between the first tuning element and the second tuning element is 80:20, 60:40, 40:60, and 20:80 (these graphs are identified by reference numbers 80, 60, 40, and 20, respectively). This graph illustrates that the linear PLL of FIGS. 1 and 2 produces a more constant gain profile than the linear PLL with a single tuning element. In particular, with 20% of the total capacitance dedicated to the first tuning element (the proportional signal path), the linear PLL has a more constant gain versus frequency than any of the other depicted cases. For the entire range of the 20% case, the relative variation is approximately 2:1. For the same frequency range, the conventional single tuning element configuration has a 5:1 variation.

Figure 6:
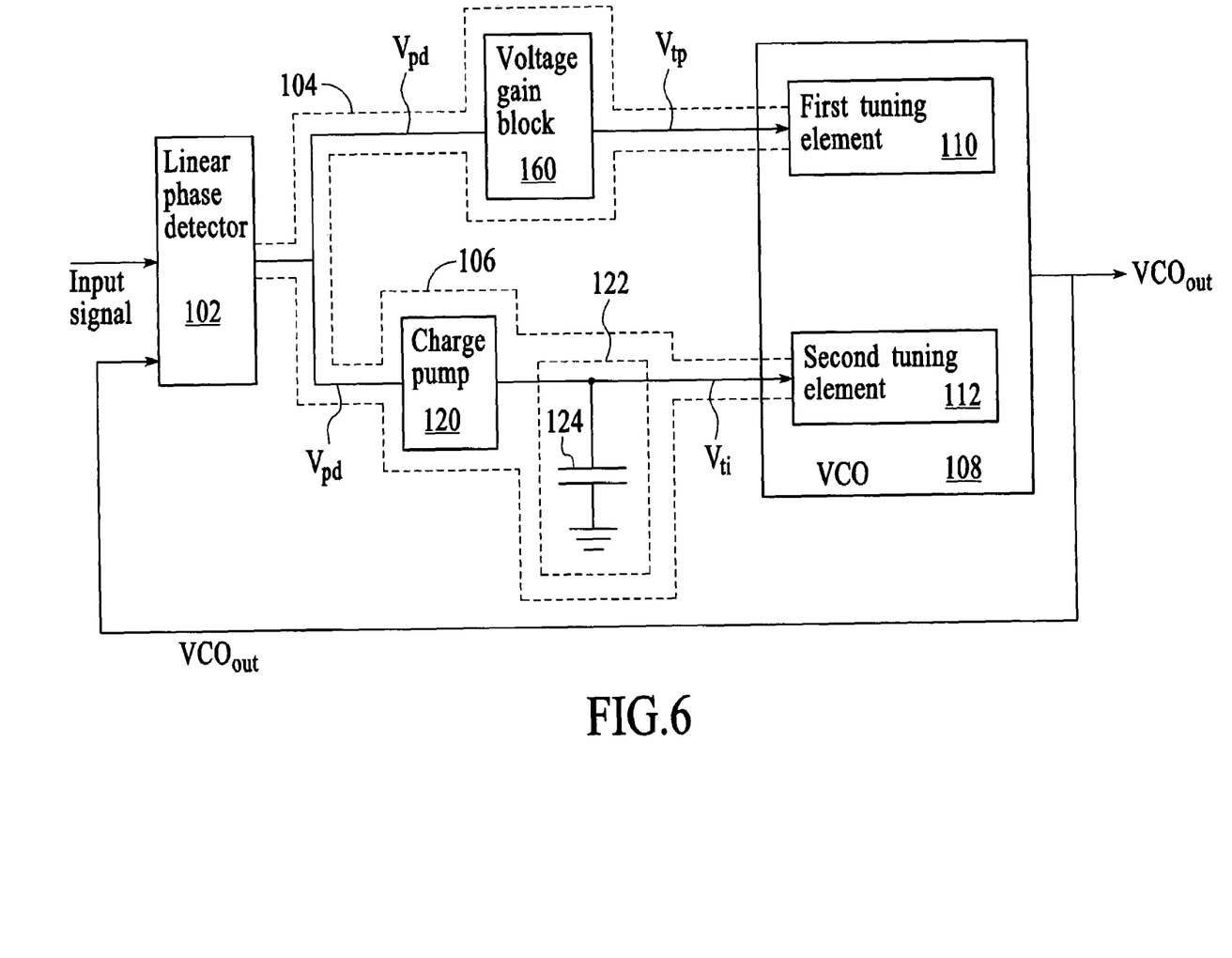
FIG. 6 depicts an embodiment of the linear PLL from FIG. 1 that includes a voltage gain block between the phase detector and the first tuning element.

It should be pointed out that the absolute value of the gain is decreased when two tuning elements are used as described above. Referring to FIG. 6, in an embodiment, the lost gain is restored by adding a voltage gain block 160 (e.g., an amplifier) between the linear phase detector 102 and the first tuning element 110. Linear voltage gain blocks are easy to achieve in monolithic circuits.

In the embodiments described with reference to FIGS. 1 and 6, the integrating signal path includes a charge pump 120 and a loop filter 122 to integrate the phase detector output voltage ($V_{pd}$). In an alternative embodiment, a different element or elements such as a digital up/down counter could be used to integrate the phase detector output voltage to produce the integrated VCO tuning signal ($V_{ti}$).

Figure 7:
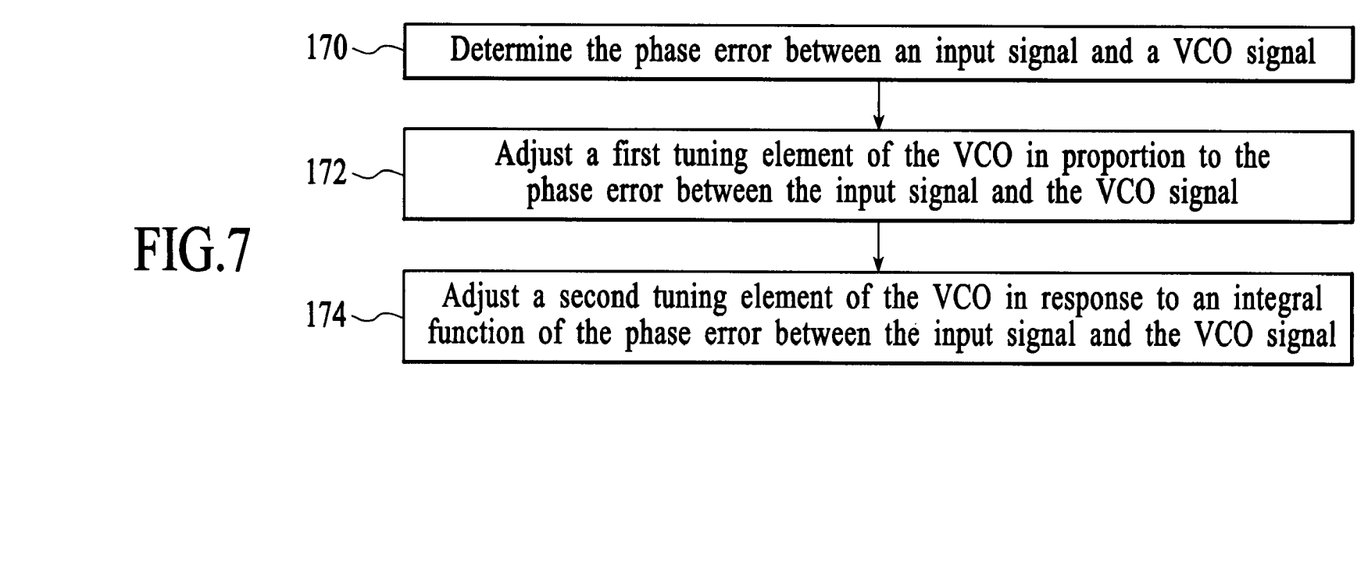
FIG. 7 is a process flow diagram of a method for operating a linear PLL that includes a VCO in accordance with an embodiment of the invention.

FIG. 7 is a process flow diagram of a method for operating a linear PLL that includes a VCO in accordance with an embodiment of the invention. At block 170, the phase error between an input signal and a VCO signal is determined. At block 172, a first tuning element of the VCO is adjusted in proportion to the phase error between the input signal and the VCO signal. At block 174, a second tuning element of the VCO is adjusted in response to an integral function of the phase error between the input signal and the VCO signal.

Although specific embodiments in accordance with the invention have been described and illustrated, the invention is not limited to the specific forms and arrangements of parts so described and illustrated. The invention is limited only by the claims.

What is claimed is:

1. A linear phase-locked loop (PLL) comprising:
   a voltage controlled oscillator (VCO) comprising first and second tuning elements, the VCO generating a VCO signal;
   a linear phase detector configured to determine the magnitude of the phase error between an input signal and the VCO signal;
   a first signal path between the linear phase detector and the first tuning element, the first signal path providing a first VCO tuning signal to the first tuning element, the first VCO tuning signal being proportional to the magnitude of the phase error between the input signal and the VCO signal; and
   a second signal path between the linear phase detector and the second tuning element, the second signal path providing a second VCO tuning signal to the second tuning element, the second VCO tuning signal being an integral function of the magnitude of the phase error between the input signal and the VCO signal; and
   wherein the VCO comprises an inductance-capacitance (LC)-type VCO with the first and second tuning elements comprising first and second varactors.

2. The linear PLL of claim 1 wherein the overall capacitance of the LC-type VCO is distributed among the first and second varactors to establish the desired balance between gain and frequency tuning range.

3. The linear PLL of claim 1 wherein the second signal path includes a charge pump and a loop filter.

4. The linear PLL of claim 1 wherein the first and second varactors have respective capacitances sized to establish the desired balance between gain and frequency tuning range.

5. A method for operating a linear phase-locked loop (PLL) that includes a voltage controlled oscillator (VCO) comprising a first tuning element and a second tuning element, the method comprising:
   determining the magnitude of the phase error between an input signal and a VCO signal;
   adjusting the first tuning element in proportion to the magnitude of the phase error between the input signal and the VCO signal; and
   adjusting the second tuning element in response to an integral function of the magnitude of the phase error between the input signal and the VCO signal;
   wherein adjusting the first and second tuning elements comprises adjusting the capacitance of the first and second tuning elements.

6. The method of claim 5 wherein adjusting the first and second tuning elements comprises adjusting the capacitance of first and second varactors of an LC-type VCO.

7. The method of claim 5 further comprising configuring the respective capacitances of the first and second tuning elements to establish the desired balance between gain and tuning range.

8. The method of claim 5 wherein adjusting the first tuning element comprises adjusting the capacitance of a first varactor and wherein adjusting the second tuning element comprises adjusting the capacitance of a second varactor.

9. The method of claim 5 further comprising increasing the voltage of an output signal that is representative of the phase error between the input signal and the VCO signal and using the output signal with the increased voltage to adjust the first tuning element.

10. A linear phase-locked loop (PLL) comprising:
    a voltage controlled oscillator (VCO) comprising first and second varactors, the VCO generating a VCO signal;
    a linear phase detector configured to determine the magnitude of the phase error between an input signal and the VCO signal;
    a first signal path between the linear phase detector and the first varactor, the first signal path providing a first VCO tuning signal to the first varactor, the first VCO tuning signal being proportional to the magnitude of the phase error between the input signal and the VCO signal; and
    a second signal path between the linear phase detector and the second tuning element, the second signal path including a loop filter, the second signal path providing a second VCO tuning signal to the second varactor, the second VCO tuning signal being an integral function of the magnitude of the phase error between the input signal and the VCO signal.

11. The linear PLL of claim 10 wherein the VCO comprises an LC-type VCO.

12. The linear PLL of claim 11 wherein the overall capacitance of the LC-type VCO is distributed among the first and second varactors to establish the desired balance between gain and frequency tuning range.

13. The linear PLL of claim 10 wherein the first and second varactors have respective capacitances sized to establish the desired balance between gain and frequency tuning range.

14. The linear PLL of claim 10 wherein the first signal path includes a voltage gain block between the linear phase detector and the first tuning element.

15. The linear PLL of claim 10 wherein the second signal path includes a charge pump between the linear phase detector and the loop filter.

16. A linear phase-locked loop (PLL) comprising:
    a voltage controlled oscillator (VCO) comprising first and second tuning elements, the VCO generating a VCO signal;
    a linear phase detector configured to determine the magnitude of the phase error between an input signal and the VCO signal;
    a first signal path between the linear phase detector and the first tuning element, the first signal path providing a first VCO tuning signal to the first tuning element, the first VCO tuning signal being proportional to the magnitude of the phase error between the input signal and the VCO signal; and
    a second signal path between the linear phase detector and the second tuning element, the second signal path providing a second VCO tuning signal to the second tuning element, the second VCO tuning signal being an integral function of the magnitude of the phase error between the input signal and the VCO signal;
    wherein the first signal path includes an amplifier between the phase detector and the first tuning element.

17. A method for operating a linear phase-locked loop (PLL) that includes a voltage controlled oscillator (VCO) comprising a first tuning element and a second tuning element, the method comprising:
    determining the magnitude of the phase error between an input signal and a VCO signal;

adjusting the first tuning element in proportion to the magnitude of the phase error between the input signal and the VCO signal;

adjusting the second tuning element in response to an integral function of the magnitude of the phase error between the input signal and the VCO signal; and configuring the respective capacitances of the first and second tuning elements to establish the desired balance between gain and tuning range.

\* \* \* \* \*